US006071781A

United States Patent [19]
Nakajima

[11] Patent Number: 6,071,781
[45] Date of Patent: Jun. 6, 2000

[54] METHOD OF FABRICATING LATERAL MOS TRANSISTOR

[75] Inventor: Chika Nakajima, Tokyo, Japan

[73] Assignee: NEC Corporation, Tokyo, Japan

[21] Appl. No.: 08/892,223

[22] Filed: Jul. 14, 1997

[30] Foreign Application Priority Data

Jul. 15, 1996 [JP] Japan ..................................... 8-184520

[51] Int. Cl.[7] .............................................. H01L 21/336
[52] U.S. Cl. ........................................... 438/291; 438/302
[58] Field of Search ..................... 438/302, 291

[56] References Cited

U.S. PATENT DOCUMENTS

| | | |
|---|---|---|
| 5,308,780 | 5/1994 | Chou et al. . |
| 5,366,915 | 11/1994 | Kodama . |
| 5,371,394 | 12/1994 | Ma et al. . |
| 5,372,957 | 12/1994 | Liang et al. . |
| 5,409,848 | 4/1995 | Han et al. . |
| 5,426,063 | 6/1995 | Kaneko et al. . |
| 5,439,835 | 8/1995 | Gonzalez . |
| 5,451,807 | 9/1995 | Fujita . |
| 5,459,085 | 10/1995 | Pasen et al. . |
| 5,578,509 | 11/1996 | Fujita . |
| 5,759,901 | 4/1995 | Loh et al. . |

FOREIGN PATENT DOCUMENTS

| | | |
|---|---|---|
| 53-35481 | 4/1978 | Japan . |
| 53-77474 | 7/1978 | Japan . |
| 53-119686 | 10/1978 | Japan . |
| 5-21788 | 1/1993 | Japan . |
| 5-211328 | 8/1993 | Japan . |

OTHER PUBLICATIONS

Device Basic Technology, 8–4–2.

*Primary Examiner*—John F. Niebling
*Assistant Examiner*—Jonathan Hack
*Attorney, Agent, or Firm*—Sughrue, Mion, Zinn, Macpeak & Seas, PLLC

[57] ABSTRACT

There is provided a method of fabricating a lateral MOS transistor, including the steps of (a) forming a gate oxide film on a semiconductor substrate, (b) forming a gate electrode on the gate oxide film, (c) forming a mask covering one of regions of the semiconductor substrate adjacent to the gate electrode, (d) ion-implanting the semiconductor substrate with impurities having a first electrical conductivity as the semiconductor substrate is being rotated around the gate electrode, at an angle relative to the semiconductor substrate to form a channel region in an uncovered region, (e) ion-implanting the semiconductor substrate with impurities having a second electrical conductivity around the gate electrode in self-aligned manner to thereby form source and drain regions. It is preferable that ion-implantation in the step (d) is carried out in the desired number of times. The above mentioned method makes it possible to form a channel region having a steep impurities-concentration profile just below the gate electrode, ensuring that performances of MOS transistor are improved, and that other MOS transistors can be formed on the same semiconductor substrate.

19 Claims, 6 Drawing Sheets

METHOD OF FABRICATING LATERAL MOS TRANSISTOR

BACKGROUND OF THE INVENTION

1. Field of the Invention

The invention relates to a method of fabricating a lateral MOS transistor, and more particularly to an improvement in ion-implantation to a channel region.

2. Description of the Related Art

In a conventional method of fabricating a lateral MOS transistor, thermal annealing is carried out at a high temperature and for a long period of time for obtaining desired channel length and breakdown voltage, after impurities have been implanted into a substrate. FIGS. 1A to 1E are cross-sectional views of a MOS transistor, illustrating respective steps of a conventional method of fabricating the same. As an example, FIGS. 1A to 1E illustrates a method of fabricating an n-channel lateral MOS transistor.

Figure 1A:
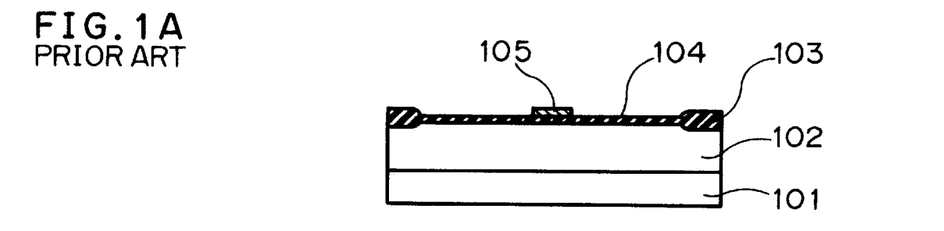
FIGS. 1A to 1E are cross-sectional views of a lateral MOS transistor, illustrating respective steps of a conventional method of fabricating the same.

As illustrated in FIG. 1A, a p-type silicon substrate 101 is implanted at a dose of $1\times10^{13}$ cm$^{-2}$ to $3\times10^{13}$ cm$^{-2}$ phosphorus (P), followed by thermal annealing at 1000° C. to 1200° C. for 8 to 12 hours to thereby form an n-type well region 102 in the p-type silicon substrate 101. Then, there are formed device isolation oxide films 103 by local oxidation of silicon (LOCOS), followed by thermal oxidation at 1000° C. to 1200° C. for about 5 to 20 minutes in O$_2$ atmosphere to thereby form a gate oxide 104 film on the silicon substrate 101. The gate oxide film 104 has a thickness in the range of 150 to 400 angstroms. Then, polysilicon is deposited over the gate oxide film 104. The polysilicon is etched so as to leave a selected region unetched by photolithography, to thereby form a gate electrode 105 on the gate oxide film 104.

Figure 1B:
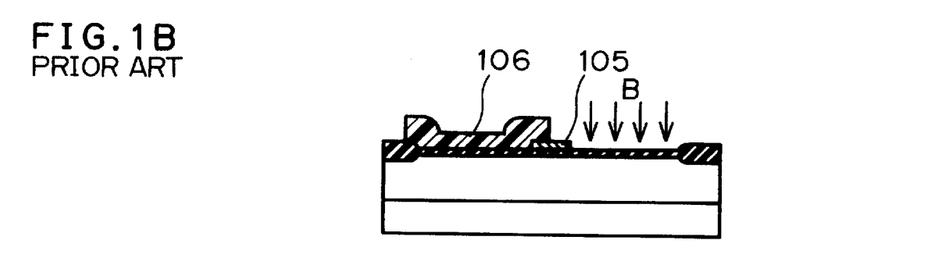

Then, photoresist is deposited over a resultant, and etched so as to leave a selected region unetched. Thus, there is formed a photoresist mask 106 which covers a region other than a region where a channel region is to be formed, as illustrated in FIG. 1B.

Figure 1C:
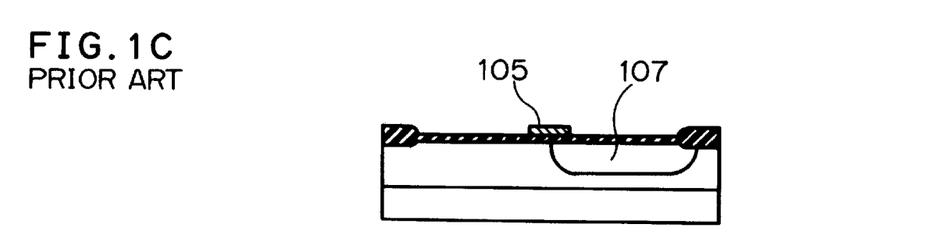

Then, the p-type silicon substrate 101 is ion-implanted at an accelerating voltage of 50 to 80 KeV at a dose of $3\times10^{13}$ cm$^{-2}$ to $5\times10^{13}$ cm$^{-2}$ boron (B), followed by thermal annealing at a high temperature for a long period of time, specifically, at 1000° C. to 1200° C. for about 50 to 80 minutes, to thereby activate and diffuse boron having been ion-implanted into the silicon substrate 101. Thus, a p-type channel region 107 is formed in the n-type well region 102, as illustrated in FIG. 1C.

Figure 1D:
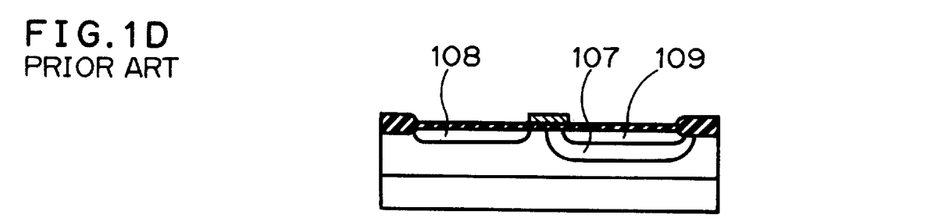

Then, as illustrated in FIG. 1D, after the photoresist mask 106 has been removed, the p-type silicon substrate 101 is ion-implanted at 80 to 160 KeV at a dose of $5\times10^{15}$ cm$^{-2}$ to $1\times10^{16}$ cm$^{-2}$ arsenic (As) or phosphorus (P), employing the gate electrode 105 as a mask in a self-aligned manner. Thus, there are formed n-type diffusion layers around the gate electrode 105, which diffusion layers act as a drain region 108 and a source region 109. Thus, the channel region 107, the drain region 108, the source region 109, and the gate electrode 105 cooperate with each other to thereby form a lateral MOS transistor.

Figure 1E:
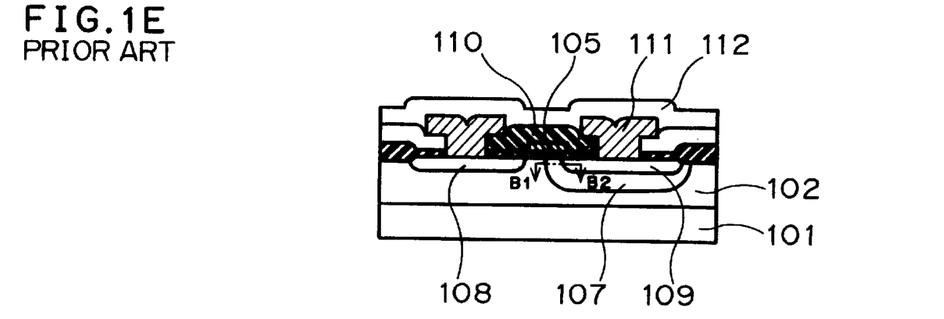

Then, as illustrated in FIG. 1E, there is formed an interlayer insulating film 110 having a thickness of about 1.0 μm over a resultant by CVD. Then, contact holes are formed through the interlayer insulating film 110 to the drain and source regions 108 and 109. Then, an aluminum film is formed by sputtering over the interlayer insulating film 110, and is etched in selected regions to thereby form drain and source electrodes 111. Then, a passivation film 112 is formed covering a resultant.

As mentioned above, when the channel region 107 is to be formed in the conventional process, the silicon substrate 101 is ion-implanted with impurities, followed by thermal annealing to thereby cause the channel region 107 to thermally diffuse to a region just below the gate electrode 105. Thus, thermal annealing at a high temperature for a long period of time, specifically, at 1000° C. to 1200° C. for about an hour, was carried out in the conventional process to horizontally diffuse the impurities to a region just below the gate electrode 105.

Figure 2:
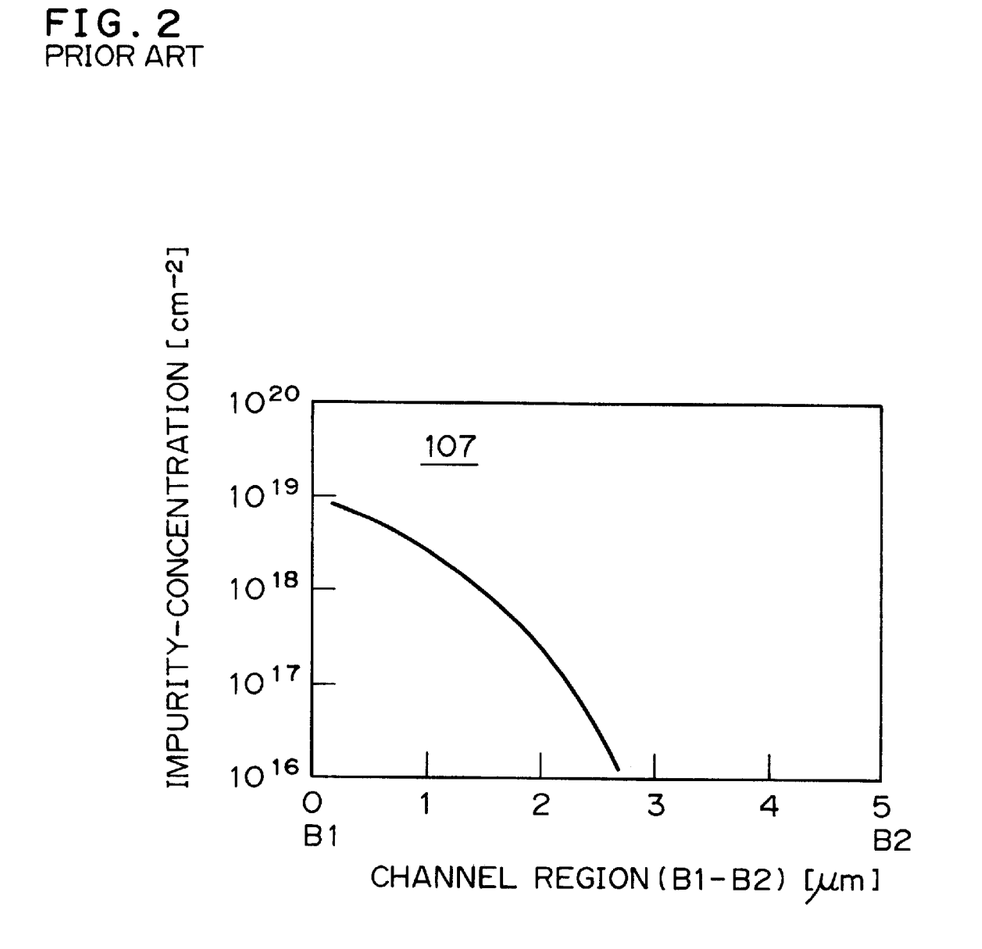
FIG. 2 is an impurity-profile in a channel region of a lateral MOS transistor fabricated in accordance with the method illustrated in FIGS. 1A to 1E.

FIG. 2 illustrates an impurities-profile in the channel region 107. As illustrated, the thermal annealing at a high temperature for a long period of time causes the impurities profile to be gently sloping in a region located just below the gate electrode 105. The gently sloped impurities-profile causes a depletion layer to expand in the region located just below the gate electrode 105, causing punch through to readily occur. In addition, the thermal annealing at a high temperature for a long period of time also causes impurity layers formed in other devices to thermally diffuse. The performances of 0.5 μm design-rule devices are in particular deteriorated. Hence, it was quite difficult in the conventional method of fabricating MOS transistor to fabricate a semiconductor integrated circuit device including a plurality of fine devices in a common substrate.

Further, DSA (diffusion self-aligned) MOS transistor is described in "Device Basic Technology" at the sub-section 8-4-2. According to the description, it would be possible to fabricate depletion type MOS transistor on a common semiconductor substrate, since a highly resistive substrate is employed.

SUMMARY OF THE INVENTION

In view of the foregoing problems of the conventional methods, it is an object of the present invention to provide a method of fabricating a lateral MOS transistor, which method is capable of forming a channel region without carrying out thermal annealing at a high temperature for a long period of time.

There is provided a method of fabricating a lateral MOS transistor including a semiconductor substrate, a gate electrode formed on the semiconductor substrate, and a channel region formed below the gate electrode, including the step of ion-implanting a region of the semiconductor substrate with impurities at an angle relative to the semiconductor substrate to thereby form the channel region.

There is further provided a method of fabricating a lateral MOS transistor including a semiconductor substrate, a gate electrode formed on the semiconductor substrate, and a channel region formed below the gate electrode and extending in a direction from the channel region, including the step of ion-implanting a region of the semiconductor substrate with impurities in the direction at such an angle relative to the semiconductor substrate that the impurities are directed toward the gate electrode, to thereby form the channel region.

There is still further provided a method of fabricating a lateral MOS transistor including a semiconductor substrate, a gate electrode formed on the semiconductor substrate, and a channel region formed below and around the gate electrode, comprising the step of ion-implanting a region of the semiconductor substrate with impurities around the gate electrode in directions at such an angle relative to the semiconductor substrate that the impurities are directed toward the gate electrode, to thereby form the channel region.

For instance, in order to ion-implant the semiconductor substrate with impurities around the gate electrode in directions, it is preferable ion-implantation is carried out with the semiconductor substrate being rotated around the gate electrode.

The above mentioned step may be repeated in the desired number of times, in which case ion-implantations may be carried out at different angles relative to the semiconductor substrate, and ion-implantations may be carried out at different accelerating voltages.

The above mentioned method may further include the step (b) of annealing the channel region at a low temperature and for a short period of time to activate the impurities ion-implanted into the channel region.

There is yet further provided a method of fabricating a lateral MOS transistor, including the steps of (a) forming a gate oxide film on a semiconductor substrate in a device formation region, (b) forming a gate electrode on the gate oxide film, (c) forming a mask covering one of regions of the semiconductor substrate adjacent to the gate electrode, (d) ion-implanting the semiconductor substrate with impurities having a first electrical conductivity at an angle relative to the semiconductor substrate to form a channel region in an uncovered region, and (e) ion-implanting the semiconductor substrate with impurities having a second electrical conductivity around the gate electrode in self-aligned manner to thereby form source and drain regions.

When the channel region is formed in a direction from the channel region, ion-implantation in the step (d) is carried out preferably in the direction. On the other hand, when the channel region is formed around the channel region, ion-implantation in the step (d) is carried out preferably around the channel region in directions. For instance, the ion-implantation in the step (d) may be carried out with the semiconductor substrate being rotated around the gate electrode.

In the method in accordance with the present invention, the ion-implantation for forming a channel region just below a gate electrode is carried out so that impurities are implanted into a semiconductor substrate at an angle relative to the semiconductor substrate. The ion-implantation is preferably carried out in a plurality of times. Thus, it is possible to form a channel region having a steep impurities-concentration profile just below a gate electrode without thermal annealing at a high temperature for a long period of time, ensuring that performances of MOS transistor are improved, and that other MOS devices can be formed on the same semiconductor substrate.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

FIGS. 3A to 3E illustrate a method in accordance with the first embodiment. In the first embodiment, a source region is formed only in a single direction from a gate electrode to a device isolation oxide film.

Figure 3A:
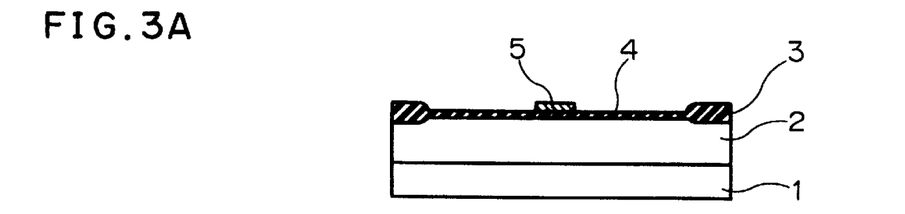
FIGS. 3A to 3E are cross-sectional views of a lateral MOS transistor, illustrating respective steps of a method of fabricating the same in accordance with the first embodiment of the present invention.

As illustrated in FIG. 3A, a p-type silicon substrate 1 is implanted at a dose of $1 \times 10^{13}$ cm$^{-2}$ to $3 \times 10^{13}$ cm$^{-2}$ phosphorus (P), followed by thermal annealing at 1000° C. to 1200° C. for 8 to 12 hours to thereby form an n-type well region 2 in the p-type silicon substrate 1. Then, there are formed device isolation oxide films 3 by local oxidation of silicon (LOCOS), followed by thermal oxidation at 1000° C. to 1200° C. for about 5 to 20 minutes in $O_2$ atmosphere to thereby form a gate oxide 4 film on the silicon substrate 1. The gate oxide film 4 has a thickness in the range of 150 to 400 angstroms. Then, polysilicon is deposited over the gate oxide film 4. The polysilicon is etched so as to leave a selected region unetched by photolithography, to thereby form a gate electrode 5 on the gate oxide film 4.

Figure 3B:
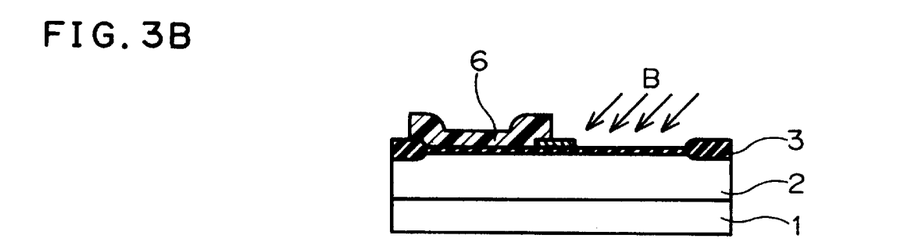

Then, photoresist is deposited over a resultant, and etched so as to leave a selected region unetched. Thus, there is formed a photoresist mask 6 which covers a region other than a region where a channel region is to be formed, as illustrated in FIG. 3B.

Figure 3C:
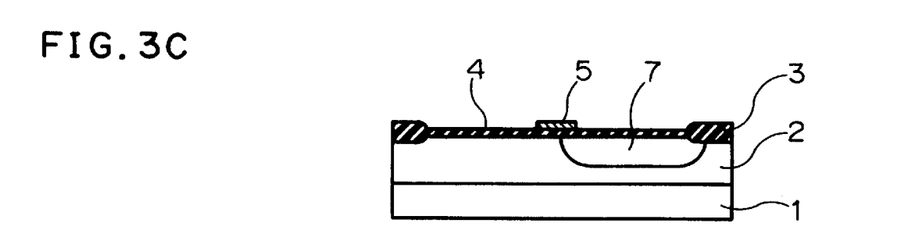

Then, the p-type silicon substrate 1 is twice ion-implanted with boron. The first ion-implantation is carried out at an accelerating voltage of 150 to 200 KeV at a dose of $3 \times 10^{13}$ cm$^{-2}$ to $5 \times 10^{13}$ cm$^{-2}$ at 45 degrees relative to the silicon substrate 1. The second ion-implantation is carried out at an accelerating voltage of 50 to 80 KeV at a dose of $3 \times 10^{13}$ cm$^{-2}$ to $5 \times 10^{13}$ cm$^{-2}$ at 45 degrees relative to the silicon substrate 1. As illustrated in FIG. 3B, boron (B) is ion-implanted so as to obliquely direct towards the gate electrode 5 in the first and second ion-implantation. Then, thermal annealing is carried out at a low temperature for a short period of time, specifically, at 1000° C. for about 5 to 15 minutes, to thereby activate the thus ion-implanted boron and diffuse the boron to a region just below the gate electrode 5. Thus, a p-type channel region 7 is formed in the n-type well region 2, as illustrated in FIG. 3C.

Figure 3D:
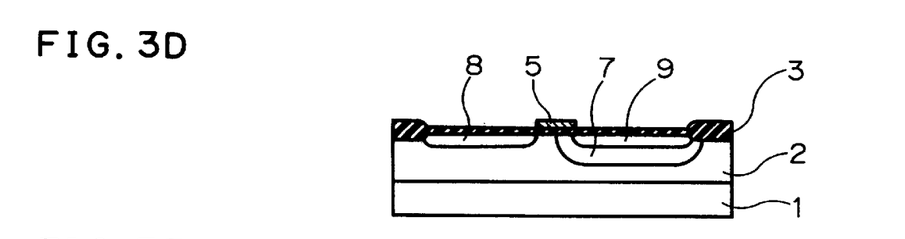

Then, as illustrated in FIG. 3D, after the photoresist mask 6 has been removed, the p-type silicon substrate 1 is ion-implanted at 80 to 160 KeV at a dose of $5 \times 10^{15}$ cm$^{-2}$ to $1 \times 10^{16}$ cm$^{-2}$ arsenic (As) or phosphorus (P), employing the gate electrode 5 as a mask in a self-aligned manner. Thus, there are formed n-type diffusion layers around the gate electrode 5, which diffusion layers act as a drain region 8 and a source region 9. Thus, the channel region 7, the drain region 8, the source region 9, and the gate electrode 5 cooperate with each other to thereby form a lateral MOS transistor.

Figure 3E:
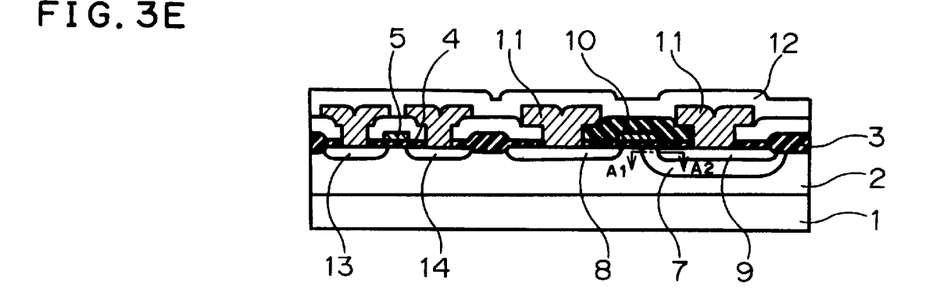

Then, as illustrated in FIG. 3E, an interlayer insulating film 10 having a thickness of about 1.0 µm is formed over a resultant by CVD. Then, there are formed contact holes reaching the drain and source regions 8 and 9 through the interlayer insulating film 10. Then, an aluminum film is formed by sputtering over the interlayer insulating film 10, and is etched in selected regions to thereby form drain and source electrodes 11. Then, a passivation film 12 is formed covering a resultant.

As illustrated in FIG. 3E, another MOS transistor is formed on the same silicon substrate. The MOS transistor is comprised of the n-type well region 2 formed in the silicon substrate 1, the gate oxide film 4 on the silicon substrate 1, the gate electrode 5 formed on the gate oxide film 4, and the p-type drain and source regions 13 and 14 formed around the gate electrode 5.

Figure 4A:
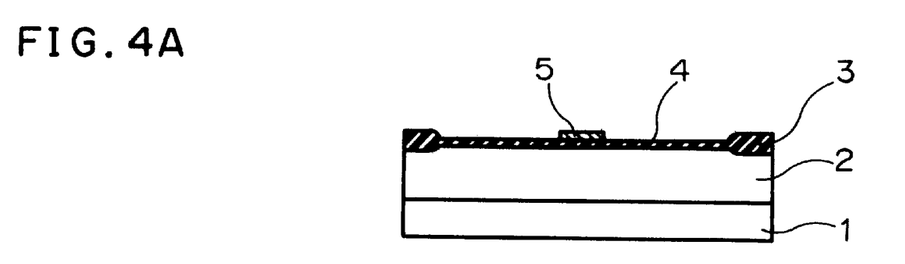
FIGS. 4A to 4C are cross-sectional views of a lateral MOS transistor, partially illustrating respective steps of a method of fabricating the same in accordance with the second embodiment of the present invention.
Figure 4B:
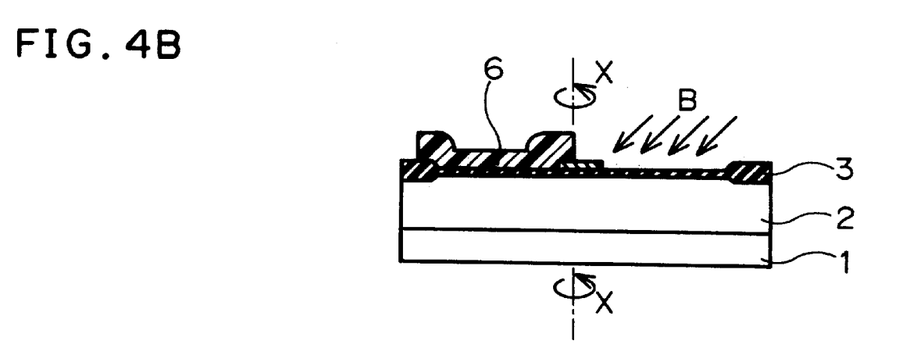
Figure 4C:
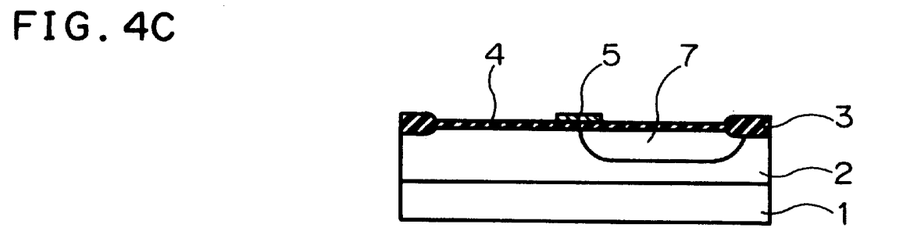

FIGS. 4A to 4C partially illustrate a method in accordance with the second embodiment. The second embodiment is different from the first embodiment in that a source region is formed around a gate electrode, in other words, in directions from a gate electrode to a device isolation oxide film.

First, as illustrated in FIG. 4A, a p-type silicon substrate 1 is implanted at a dose of $1 \times 10^{13}$ cm$^{-2}$ to $3 \times 10^{13}$ cm$^{-2}$ phosphorus (P), followed by thermal annealing at 1000° C. to 1200° C. for 8 to 12 hours to thereby form an n-type well region 2 in the p-type silicon substrate 1. Then, there are formed device isolation oxide films 3 by local oxidation of silicon (LOCOS), followed by thermal oxidation at 1000° C. to 1200° C. for about 5 to 20 minutes in $O_2$ atmosphere to thereby form a gate oxide 4 film on the silicon substrate 1. The gate oxide film 4 has a thickness in the range of 150 to 400 angstroms. Then, polysilicon is deposited over the gate oxide film 4. The polysilicon is etched so as to leave a selected region unetched by photolithography, to thereby form a gate electrode 5 on the gate oxide film 4.

Then, photoresist is deposited over a resultant, and etched so as to leave a selected region unetched. Thus, there is formed a photoresist mask 6 which covers a region other than a region where a channel region is to be formed, as illustrated in FIG. 4B.

Then, the p-type silicon substrate 1 is twice ion-implanted with boron (B). The first ion-implantation is carried out at an accelerating voltage of 150 to 200 KeV at a dose of $3 \times 10^{13}$ cm$^{-2}$ to $5 \times 10^{13}$ cm$^{-2}$ at 45 degrees relative to the silicon substrate 1 as the silicon substrate 1 is being rotated around the gate electrode 5 in a direction indicated with an arrow X. The second ion-implantation is carried out at an accelerating voltage of 50 to 80 KeV at a dose of $3 \times 10^{13}$ cm$^{-2}$ to $5 \times 10^{13}$ cm$^{-2}$ at 45 degrees relative to the silicon substrate 1 as the silicon substrate 1 is being rotated around the gate electrode 5 in a direction indicated with an arrow X. As illustrated in FIG. 4B, boron (B) is ion-implanted so as to obliquely direct towards the gate electrode 5 in the first and second ion-implantation. Then, thermal annealing is carried out at a low temperature for a short period of time, specifically, at 1000° C. for about 5 to 15 minutes, to thereby activate the thus ion-implanted boron and diffuse the boron to a region just below the gate electrode 5. Thus, a p-type channel region 7 is formed in the n-type well region 2, as illustrated in FIG. 4C.

The steps to be carried out later are the same as the steps having been explained with reference to FIGS. 3D and 3E.

In the above mentioned embodiment, boron is obliquely ion-implanted into the silicon substrate 1 with the silicon substrate 1 being rotated. It should be noted that the silicon substrate 1 may be kept stationary and boron may be implanted around the gate electrode 5 in degrees sufficient to cover the channel region 7.

In the first embodiment, since the source region 9 is formed only in a single direction from the gate electrode 5 to the device isolation oxide film 3 located at the right in FIG. 3D, what is necessary to do is that the silicon substrate 1 is ion-implanted with boron only in the direction. It is not necessary for the silicon substrate 1 to be ion-implanted in other directions. Thus, the silicon substrate 1 is not necessary to be rotated when ion-implanted in the first embodiment. On the other hand, the source region 9 is formed radially around the gate electrode 5, that is, in directions around the gate electrode 5. Hence, the silicon substrate 1 is necessary to be rotated when ion-implanted, in order to form the channel region 7 around the gate electrode 5. As mentioned earlier, the silicon substrate 1 may be kept stationary, and boron may be implanted around the gate electrode 5 in necessary degrees.

As mentioned above, when the channel region 7 is to be formed in the first and second embodiments, impurities are ion-implanted at an angle into the silicon substrate 1 with the silicon substrate 1 being rotated (only in the second embodiment). Hence, it is possible to form the channel region 7 so that the channel region 7 extends jut below the gate electrode 5, even if the ion-implantation is not followed by thermal annealing at a high temperature for a long period of time.

Figure 5:
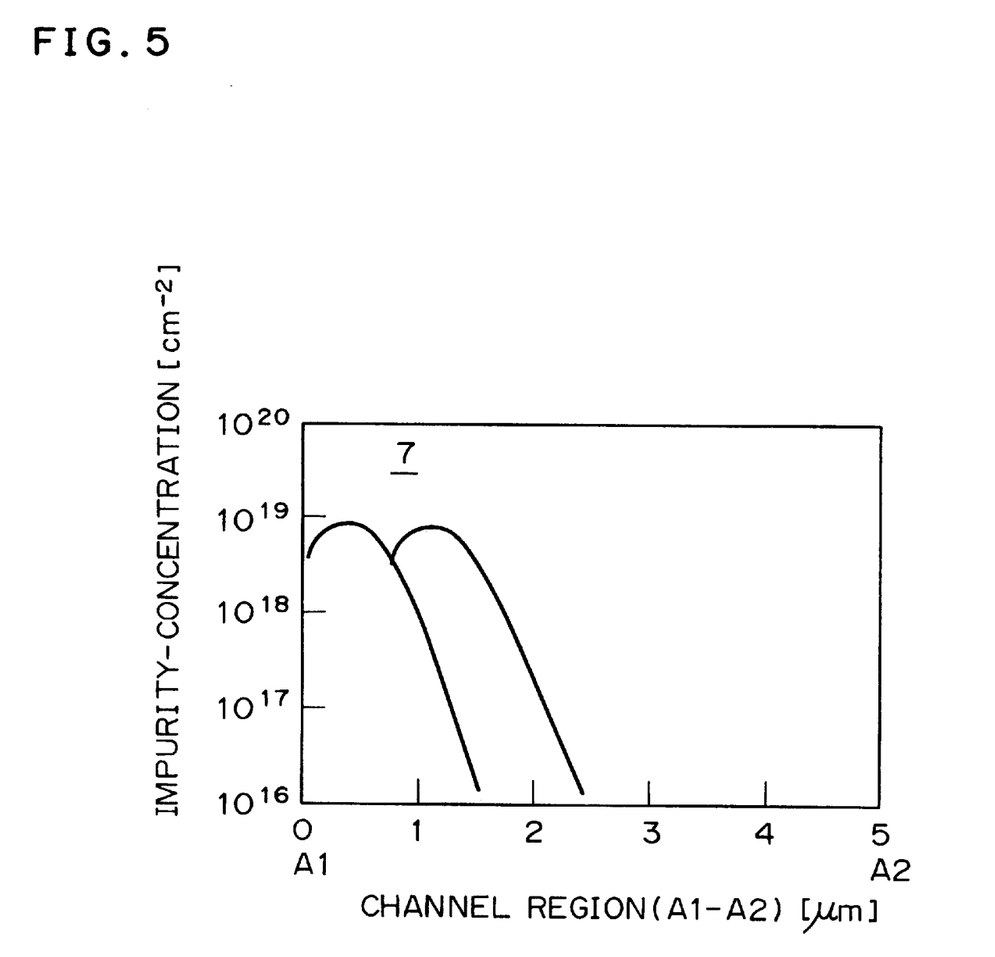
FIG. 5 is an impurity-profile in a channel region of a lateral MOS transistor fabricated in accordance with the method illustrated in FIGS. 3A to 3E.

In addition, since the ion-implantation is carried out twice at different accelerating voltages, there is produced a difference in ion-implantation depth due to a difference in accelerating voltage, ensuring the formation of a channel region having a combination of different impurity-profiles. FIG. 5 illustrates an impurity-concentration profile in a transverse cross-section taken along the line A1-A2 in the channel region 7 in FIG. 3E. The above mentioned difference in ion-implantation depth and the shorter period of time for thermal annealing cooperate with each other to thereby establish a steep concentration profile in a transverse cross-section of the channel region 7, as illustrated in FIG. 5.

Accordingly, it is possible to make a concentration of the channel region 7 higher, which ensures prevention of extension of a depletion layer and enhancement of a breakdown voltage of the channel region 7. In addition, the reduction of a temperature and shorter period of time both in thermal annealing prevents impurity diffusion layers in other MOS transistors from being unintentionally diffused, and hence it would be possible to fabricate a CMOS semiconductor integrated circuit device including other MOS devices such as 0.5 μm design-rule devices on the same semiconductor substrate.

Figure 6:
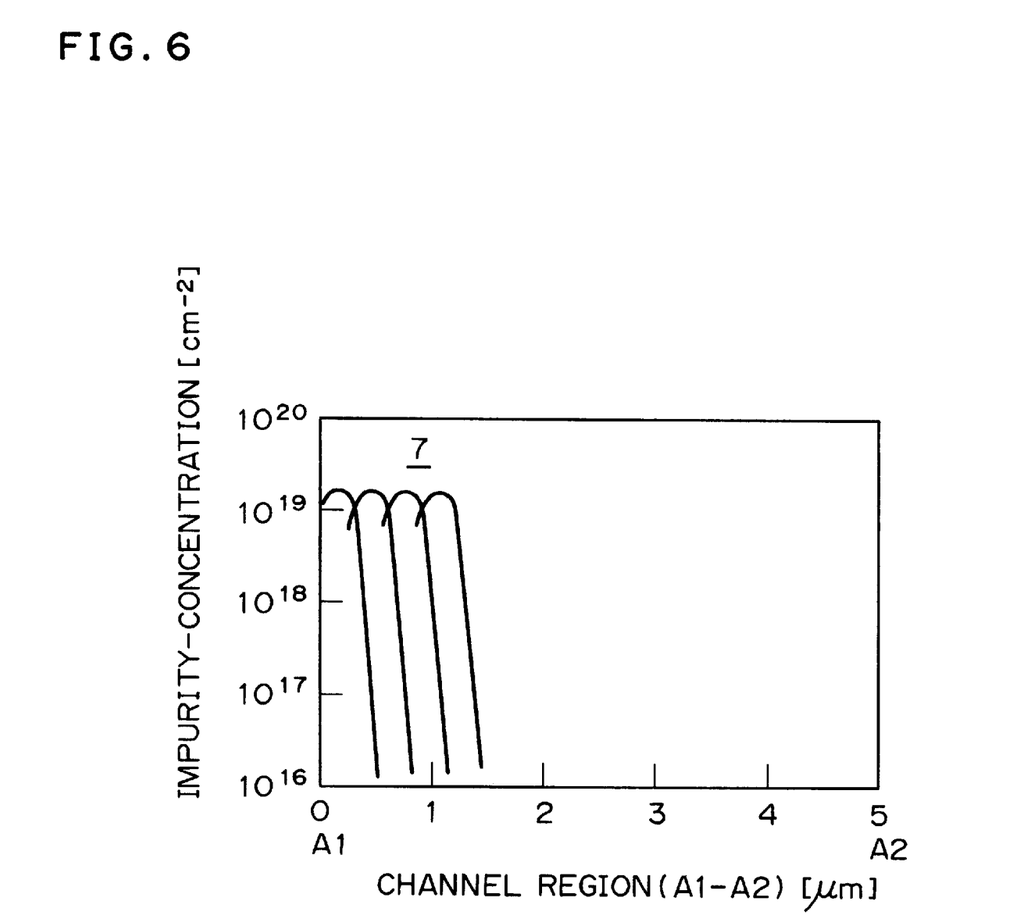
FIG. 6 is an impurity-profile in a channel region of a lateral MOS transistor fabricated in accordance with another embodiment of the present invention.

The angle at which the channel region 7 is ion-implanted with impurities and the number of ion-implantations are not limited to those referred to in the first and second embodiments. For instance, as the silicon substrate 1 is being rotated around the gate electrode 5, the silicon substrate 1 may be ion-implanted with boron at 60 degrees relative to a surface of the silicon substrate 1. Then, the silicon substrate 1 may be ion-implanted a plurality of times at a dose of $3 \times 10^{13}$ cm$^{-2}$ to $5 \times 10^{13}$ cm$^{-2}$ with an accelerating voltage being varied in the range of 200 KeV to 500 KeV. The obtained impurity-concentration profile in the channel region 7 at the line A1-A2 is illustrated in FIG. 6. As illustrated, there is obtained a quite steep impurity-concentration profile established by carrying out ion-implantations a plurality of times. In addition, since the channel region 7 extends to a region just below the gate electrode 5, it is possible to shorten a period of time for thermal annealing and to form other MOS transistors on the same substrate.

It is also possible to determine a concentration of impurities or a dose, an accelerating voltage and the number of ion-implantations in accordance with required dose and impurity-concentration profile. A threshold voltage of MOS transistor is dependent on a surface concentration of a channel region, and the surface concentration is controlled by a dose of impurities to be ion-implanted into a silicon substrate.

In the above mentioned first and second embodiments, the n-type well region 2 is formed in the p-type silicon substrate 1 for fabricating the n-channel MOS transistor, however, the skilled in the art would readily understand that an n-channel MOS transistor may be fabricated on an n-type silicon substrate. The present invention may be applied to a p-channel MOS transistor.

The first and second ion-implantations are carried out at the same angle relative to the silicon substrate 1 both in the first and second embodiments. Different angles may be chosen for each of the ion-implantations. For instance, the first ion-implantation may be carried out at 45 degrees, and the second one at 30 degrees.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-184520 filed on Jul. 15, 1996 including specification, claims, drawings and summary is incorporated herein by reference in its entirety.

What is claimed is:

1. A method of fabricating a lateral MOS transistor including a semiconductor substrate, a gate electrode formed on said semiconductor substrate, and a channel region formed below said gate electrode, comprising:
    (a) ion-implanting a region of said semiconductor substrate with a first impurity concentration using an acceleration voltage range of about 150 to 200 keV, thereby forming a first portion of said channel region; and
    (b) ion-implanting a region of said semiconductor substrate with a second impurity concentration using an acceleration voltage range of about 50 to 80 keV, thereby forming a second portion of said channel region.

2. The method as set forth in claim 1, wherein said first impurity concentration is ion-implanted at a first angle relative to said semiconductor substrate, and said second impurity concentration is ion-implanted at a second angle relative to said semiconductor substrate.

3. The method as set forth in claim 1, further comprising annealing said channel region at a predetermined temperature and for a predetermined time interval to activate said first impurity concentration and said second impurity concentration ion-implanted into said channel region.

4. A method of fabricating a lateral MOS transistor including a semiconductor substrate, a gate electrode formed on said semiconductor substrate, and a channel region formed below said gate electrode, comprising:
    (a) ion-implanting a region of said semiconductor substrate with a first impurity concentration using an acceleration voltage range of about 150 to 200 keV at a first angle relative to said semiconductor substrate such that the ions of said first impurity concentration are directed toward said gate electrode, thereby forming a first portion of said channel region; and
    (b) ion-implanting a region of said semiconductor substrate with a second impurity concentration using an acceleration voltage range of about 50 to 80 keV at a second angle relative to said semiconductor substrate such that the ions of said second impurity concentration are directed towards said gate electrode, thereby forming a second portion of said channel region.

5. The method as set forth in claim 4, wherein said first angle relative to said semiconductor substrate is different than said second angle relative to said semiconductor substrate.

6. The method as set forth in claim 4, further comprising annealing said channel region at a predetermined temperature and for a predetermined time interval to activate said first impurity concentration and said second impurity concentration ion-implanted into said channel region.

7. The method as set forth in claim 1, further including ion-implanting a region of said semiconductor substrate with a third impurity concentration using an acceleration voltage range of about 80 to 160 keV, thereby forming source and drain regions.

8. The method as set forth in claim 2, wherein said first angle is forty-five degrees relative to said semiconductor substrate, and said second angle is thirty degrees relative to said semiconductor substrate.

9. The method as set forth in claim 4, further including ion-implanting a region of said semiconductor substrate with a third impurity concentration using an acceleration voltage range of about 80 to 160 keV, thereby forming source and drain regions.

10. The method as set forth in claim 5, wherein said first angle is forty-five degrees relative to said semiconductor substrate and said second angle is thirty degrees relative to said semiconductor substrate.

11. A method of fabricating a lateral MOS transistor including a semiconductor substrate, a gate electrode formed on said semiconductor substrate, and a channel region formed below and around said gate electrode, comprising:
    (a) ion-implanting a region of said semiconductor substrate with a first impurity concentration using an acceleration voltage range of about 150 to 200 keV while said semiconductor substrate is rotated around said gate electrode, such that the ions of said first impurity concentration are directed toward said gate electrode, thereby forming a first portion of said channel region; and
    (b) ion-implanting a region of said semiconductor substrate with a second impurity concentration using an acceleration voltage range of about 50 to 80 keV while said semiconductor substrate is rotated around said gate electrode, such that the ions of said second impurity concentration are directed toward said gate electrode, thereby forming a second portion of said channel region.

12. The method as set forth in claim 11; wherein said first impurity concentration is ion-implanted at a first angle relative to said semiconductor substrate, and said second impurity concentration is ion-implanted at a second angle relative to said semiconductor substrate.

13. The method as set forth in claim 11, further comprising annealing said channel region at a predetermined temperature and for a predetermined time interval to activate said first impurity concentration and said second impurity concentration ion-implanted into said channel region.

14. The method as set forth in claim 11, further including ion-implanting a region of said semiconductor substrate with a third impurity concentration using an acceleration voltage range of about 80 to 160 keV, thereby forming source region and drain regions.

15. The method as set forth in claim 12, wherein said first angle is forty-five degrees relative to said semiconductor substrate and said second angle is thirty degrees relative to said semiconductor substrate.

16. A method of fabricating a lateral MOS transistor, comprising:

(a) forming a gate oxide film on a semiconductor substrate in a device formation region;

(b) forming a gate electrode on said gate oxide film;

(c) forming a mask covering one of regions of said semiconductor substrate adjacent to said gate electrode;

(d) ion-implanting said semiconductor substrate with a first impurity concentration using an acceleration voltage range of about 150 to 220 keV while said semiconductor substrate is rotated, thereby forming a first portion of said channel region in an uncovered region;

(e) ion-implanting a region of said semiconductor substrate with a second impurity concentration using an acceleration voltage range of about 50 to 80 keV while said semiconductor substrate is rotated, thereby forming a second portion of said channel region in an uncovered region; and (f) ion-implanting said semiconductor substrate with a third impurity concentration using an acceleration voltage range of about 80 to 160 keV around said gate electrode in self-aligned fashion, thereby forming source and drain regions.

17. The method as set forth in claim 16, wherein said first impurity concentration is ion-implanted at a first angle relative to said semiconductor substrate, and said second impurity concentration is ion-implanted at a second angle relative to said semiconductor substrate.

18. The method as set forth in claim 16, further comprising annealing said channel region at a predetermined temperature and for a predetermined time interval to activate said first impurity concentration and said second impurity concentration ion-implanted into said channel region.

19. The method as set forth in claim 17, wherein said first angle is forty-five degrees relative to said semiconductor substrate and said second angle is thirty degrees relative to said semiconductor substrate.

* * * * *